United States Patent [19]

Negishi

[11] Patent Number: 4,748,633
[45] Date of Patent: May 31, 1988

[54] SEMICONDUCTOR LASER DRIVE CIRCUIT IN LASER BEAM PRINTER

[75] Inventor: Kiyoshi Negishi, Tokyo, Japan

[73] Assignee: Asahi Kogaku Kogyo Kabushiki Kaisha, Tokyo, Japan

[21] Appl. No.: 48,204

[22] Filed: May 11, 1987

[30] Foreign Application Priority Data

May 9, 1986 [JP] Japan .............................. 61-68777[U]
May 9, 1986 [JP] Japan .............................. 61-68778[U]

[51] Int. Cl.[4] .............................................. H01S 3/00
[52] U.S. Cl. ........................................ 372/38; 372/29; 372/26
[58] Field of Search ........................ 372/38, 29, 43, 26

[56] References Cited

U.S. PATENT DOCUMENTS 4,412,331 10/1983 Chapman .............................. 372/38
4,539,686 9/1985 Bosch et al. .......................... 372/38
4,639,924 1/1987 Tsunekawa ........................... 372/38

Primary Examiner—Leon Scott, Jr.
Attorney, Agent, or Firm—Sughrue, Mion, Zinn, Macpeak and Seas

[57] ABSTRACT

A semiconductor laser drive circuit in which a constant current circuit responds to the voltage developed by the constant current across a grounded resistor and in which a buffer circuit, such as a base-grounded transistor, is interposed between the source of the constant current and the laser.

9 Claims, 2 Drawing Sheets

FIG. 1 PRIOR ART
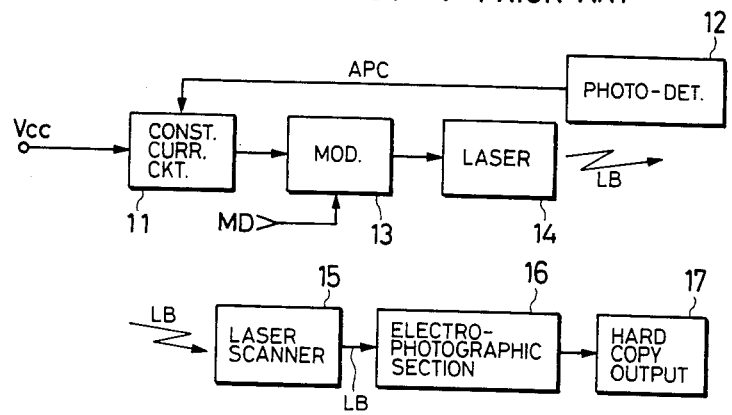
PRIOR ART FIG. 2
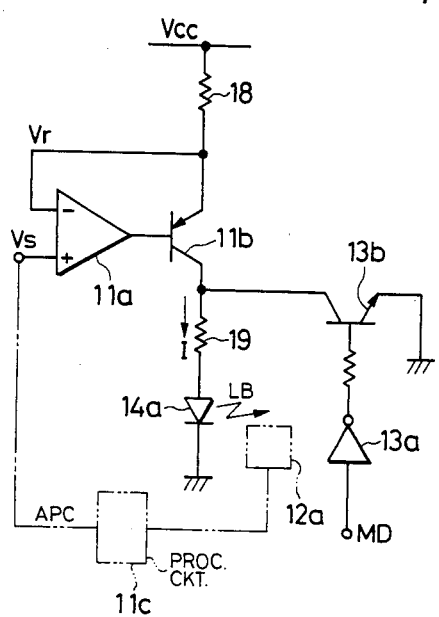
PRIOR ART FIG. 3
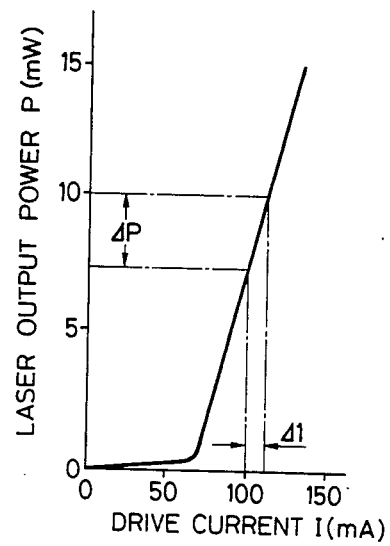

SEMICONDUCTOR LASER DRIVE CIRCUIT IN LASER BEAM PRINTER

BACKGROUND OF THE INVENTION

1. Field of the Invention

This invention relates to a semiconductor laser drive circuit in a laser beam printer using a semiconductor laser beam.

2. Background of the Invention

A so-called "laser beam printer" is being extensively employed in which a charged photo-sensitive material is scanned with a laser beam modulated with printing input data on characters, pictures, symbols, etc. to form a latent image. The latent image thus formed is developed, transferred and fixed for obtaining a hard copy of the printing input data. A printer of this type using a semiconductor laser beam has been practically used already.

FIG. 1 is a block diagram outlining the arrangement of a laser beam printer using a semiconductor laser beam. In FIG. 1, a feedback circuit 11 (or constant current circuit) includes a photo-detector 12. A modulating circuit 13 receives its output and provides its modulated output to a semiconductor laser 14 (laser diode). In the laser beam printer thus organized, a laser beam LB modulated with printing input data MD is outputted by the semiconductor laser 14.

The printing input data MD are applied to the modulating circuit 13 directly from a computer or through a memory medium such as a magnetic tape or a magnetic (or optical) disk with the aid of an interface.

In the modulating circuit 13, a current is subjected to an ON/OFF modulation with the printing input data MD. The semiconductor laser 14 produces a laser beam LB according to the current thus modulated.

On the other hand, the photodetector 12 detects the power of the laser beam LB. When the power is lower than a predetermined value, the feedback circuit 11 is activated to increase the power to the predetermined value. That is, the constant current feedback circuit 11 and the photodetector 12 form an automatic power control (APC) for stabilizing the power of the laser beam LB.

Further in FIG. 1, a laser beam scanning section 15 receives the modulated laser beam LB and the scanned laser beam is taken by an electrophotographic processing section 16. A hard copy output section 17 provides the final paper output.

The laser beam scanning section 15 has a polygon mirror, which is rotated by a drive motor at a constant speed to reflect the laser beam LB so that a photosensitive drum is scanned with the laser beam LB.

The electrophotographic processing section 16 has a charged photosensitive drum, a charging unit, a discharging unit, and a developing unit. In the electrophotographic processing section 16, an electrostatic latent image is formed on the photosensitive drum by the laser beam LB scanning it, and is developed by the developing unit.

The hard copy output section 17 includes a transferring unit, a sheet supplying and removing unit, and a fixing unit. In the hard copy output section 17, the image developed on the photosensitive drum is printed on a printing sheet, that is, is produced as a hard copy of the printing input data.

The printer using the semiconductor laser beam is advantageous in that it is small in size and low in manufacturing cost. However, it is disadvantageous in that, since the semiconductor laser is employed, the operation is liable to be adversely affected by the variation of the supply voltage or the ambient temperature. Thus, the power of the laser beam is unstable.

The disadvantages of the printer will be described with reference to FIGS. 2 and 3 in more detail.

FIG. 2 is a circuit diagram showing the feedback circuit 11, the photodetector 12, the modulating circuit 13, and the semiconductor laser 14 in more detail.

The feedback circuit 11 comprises a p-i-n photodiode 12a with fast response and a constant current circuit including an operational amplifier 11a which receives as differential input voltages a reference signal $V_r$ and a detection voltage $V_s$ which a processing circuit 11c outputs in response to the current detected by the photodiode 12a. An amplifying transistor 11b receives at its base the output of the operational amplifier 11a.

The processing circuit 11c operates to control printing gradations and to adjust the power of the laser beam LB affected for instance by the ambient temperature.

The modulating circuit 13 is made up of a switching transistor 13b to the base of which input printing data MD are applied through an inverter 13a.

The semiconductor laser 14 employs a laser diode 14a which is connected through a resistor 19 connected to the collector of the transistor 11b which is emitter-grounded through a resistor 18.

FIG. 3 is a graphical representation indicating one example of the output characteristic of the laser diode 14a, in which the horizontal axis represents the drive current I to the resistor and the vertical axis represent beam output power P. The output characteristic was obtained at an ambient temperature of 25° C. Therefore, when the ambient temperature is lower than 25° C., the output characteristic curve is shifted to the left and when it is higher than 25° C., the output characteristic curve is shifted to the right.

In the circuit thus organized, the drive current I in the laser diode 14a can be characterized as follows;

$$I=(V_{cc}-V_s)/R$$

Where R is the resistance of the resistor 18.

As is apparent from the above equation, the drive current I changes with the supply voltage $V_{cc}$. This is because the reference voltage $V_r$ of the operational amplifier 11a depends on the supply voltage $V_{cc}$. The supply voltage $V_{cc}$ is, in general, obtained from a constant voltage circuit. Therefore, a great change of the drive current is rarely caused. However, even a small change of the drive current is not preferable because, owing to the output characteristic of the laser diode 14a, the small change in the drive current I appears as a large variation in the laser beam output P.

This relation can be understood from FIG. 3. When the drive current I changes slightly, as much as ΔI, then it appears as a large variation ΔP in the laser beam output.

The variation of the laser beam output P out of a predetermined range not only lowers the quality of the hard copy, but also causes erroneous modulation. Therefore, it is desirable to stably maintain the supply voltage to thereby suppress the variation of the drive current I as much as possible. However, since the constant voltage circuit itself, being affected by the ambient temperature and electrical noises, changes its output voltage, the above described problem is still involved.

In the above-described semiconductor drive circuit, while the laser beam is being modulated, a voltage developed across the laser diode 14a and the resistor 19 changes greatly, thus affecting the feedback circuit 11. That is, the voltage obstructs the supply of the constant current by the feedback circuit 11, with the result that the above-described difficulty takes place.

SUMMARY OF THE INVENTION

In view of the foregoing, an object of this invention is to develop a novel buffer circuit capable of lessening a voltage variation accompanying the modulation of a laser beam.

Another object of this invention is to provide a semiconductor laser drive circuit in which a drive current flowing in the semiconductor laser is not affected by the variation of the supply voltage.

The foregoing object of the invention has been achieved by the provision of a semiconductor laser drive circuit for a laser beam printer. According to the invention, this laser drive circuit comprises a semiconductor laser to which a constant current circuit supplies a drive current and a buffer circuit provided in a constant current path between the constant current circuit and the semiconductor laser. Also, the constant current circuit for the laser or an auxiliary controlling constant current circuit regulates the constant current according to a voltage developed by the constant current across a grounded resistor.

In the semiconductor laser drive circuit of the invention, the high-speed modulation of the laser beam is carried out by modulating the drive current of the semiconductor laser. Therefore during the modulation the terminal voltage of the semiconductor laser is greatly changed. However, the voltage variation, being lessened by the buffer circuit, is not transmitted to the constant current circuit, with the result that the drive current of the semiconductor laser is scarcely affected by the voltage variation. The constant current circuit outputs a constant current by receiving a predetermined voltage which is developed across the resistor with the ground potential as a reference. Therefore, the constant current circuit is scarcely affected by the variation of the supply voltage, and accordingly the drive current of the semiconductor laser controlled by the constant current circuit is hardly affected by the variation of the supply voltage.

BRIEF DESCRIPTION OF THE DRAWINGS

FIG. 1 is a block diagram outlining the arrangement of a laser beam printer using a semiconductor laser beam.

FIG. 2 is a circuit diagram showing one example of a conventional semiconductor laser drive circuit.

FIG. 3 is a graphical representation showing one example of the output characteristic of a laser diode.

DETAILED DESCRIPTION OF THE PREFERRED EMBODIMENTS

Figure 4:
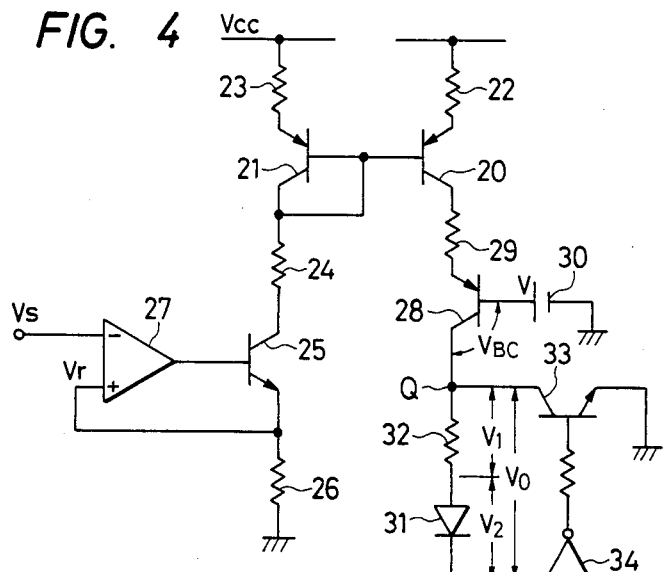
FIG. 4 is a circuit diagram showing a first example of a semiconductor laser drive circuit according to this invention.

FIG. 4 is a circuit diagram showing a first example of a semiconductor laser drive circuit according to this invention.

In FIG. 4, a first transistor 20 is used for producing constant current and a second transistor 21 is used for bias. The bases of the first and second transistor 20 and 21 are connected to each other. The second transistor 21 is diode-connected, i.e., in the second transistor 21, its base is connected to its collector. That is, the first and second transistors 20 and 21 thus connected form a first constant current circuit. Further in FIG. 4, emitter resistors 22 and 23 are connected from respective emitters to a power supply $V_{cc}$, and a negative feedback resistor 24 is connected to the collector of the second transistor 21. In the constant current circuit, the emitter resistor 23 and the second transistor 21 form a bias circuit, and the resistor 24 acts as negative feedback means when the supply voltage $V_{cc}$ changes, thus contributing to the formation of a constant current. It is desirable that the resistance of the feedback resistor 24 is relatively large.

An amplifying transistor 25 is connected through the feedback resistor 24 to the main current path of the second transistor 21. The transistor 25 is emitter-grounded through a resistor 26 for developing a reference signal $V_r$. The reference signal $V_r$ developed across the resistor 26 and the detection signal $V_s$ described with reference to the conventional semiconductor laser drive circuit are applied to an operational amplifier 27, the output of which is supplied to the base of the aforementioned amplifying transistor 25. That is, the amplifying transistor 25 and the operational amplifier 25 form a second constant current circuit which is part of the above-described automatic power control (APC).

The second constant current circuit thus formed is scarcely affected by the variation of the supply voltage, because the reference voltage $V_r$ is determined according to the ground potential.

A base-grounded transistor 28 forms a buffer circuit. The emitter of the buffer transistor 28 is connected through a resistor 29 to the first transistor 20, and the base of the buffer transistor 28 is grounded through a bias power source 30.

A laser diode 31 forms a semiconductor laser. The anode of the diode 31 is connected through a resistor 32 to the collector of the buffer transistor 28, and the cathode is grounded.

A transistor 33 and an inverter 34 form a modulating circuit similarly as in the conventional semiconductor laser drive circuit. A drive current flowing in the laser diode 31 is modulated with printing input data MD applied to the transistor 33 through the inverter 34.

In the semiconductor laser drive circuit thus organized, the collector current of the second transistor 21 is determined by the automatic power control (APC), and the first transistor 20 is biased according to the collector current thus determined, thus providing a constant current. The automatic power control (APC) acts as negative feedback means, so that, when the laser beam power of the laser diode 31 is higher than a predetermined value, the constant current is decreased with $V_s > V_r$, and when the laser beam power is lower than the predetermined value, the constant current is increased with $V_s < V_r$. That is, the automatic power control automatically controls the laser beam power so that the laser beam power reaches the predetermined value.

The laser diode 31 produces the laser beam with the aid of the drive current supplied by the constant current circuit. The laser beam thus produced is modulated with the printing input data MD by the modulating circuit. In the modulation, a voltage $V_o$ at the connecting point Q of the resistor 32 and the buffer transistor 28 referenced to ground is greatly changed at frequencies of the order of megahertz (MHz) as the modulating transistor 33 is turned on and off. However, the variation of the modulation voltage, being lessened by the base-grounded buffer transistor 28, is not transmitted to the constant current circuit. The base-grounded buffer transistor 28, being high in output impedance and excellent in high frequency characteristic, acts effectively as a buffer between the constant current circuit and the modulating circuit. Accordingly, a constant current is sufficiently supplied to the modulating irrespective of the modulated variation of the voltage $V_o$.

The voltage V of the power source 30 for the base of the buffer transistor 28 is determined as follows:

$$V \geq V_{BC} + V_1 + V_2$$

where $V_{BC}$ is the collector-base voltage of the buffer transistor 28, and $V_1$ and $V_2$ are the voltages developed across the resistor 32 and the laser diode 31, respectively.

As is apparent from the above description, the first and second constant current circuits are scarcely affected by the variation of the supply voltage $V_{cc}$, and accordingly the drive current of the laser diode 31 is neither affected by the variation of the supply voltage.

The drive circuit described above is for a cathode-grounded laser diode 31. In the case where an anode-grounded laser diode is employed, a drive circuit as shown in FIG. 5 may be used with the same effects.

Figure 5:
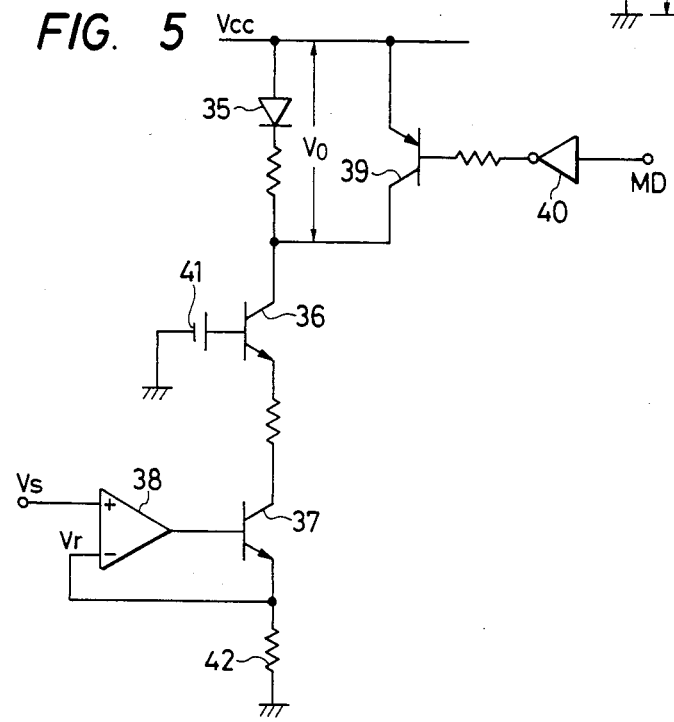
FIG. 5 is a circuit diagram showing a second example of the semiconductor laser drive circuit according to the invention.

FIG. 5 shows a second example of the semiconductor laser drive circuit according to the invention. In the second example, a buffer circuit includes a base-grounded transistor 36. A constant current circuit includes a transistor 37 and an operational amplifier 38. This constant current circuit is similar to the second constant current in FIG. 1. Both the buffer circuit and the constant current circuit are provided on the side of the cathode of a laser diode 35. Further in FIG. 5, a transistor 39 and an inverter 40 form a modulating circuit. The base of the buffer transistor is connected to a bias power source 41. In the circuit of FIG. 5, the variation of the supply voltage $V_{cc}$ is lessened by the buffer transistor 36, and therefore a drive current flowing in the laser diode 35 is determined principally by a resistor 42, across which a voltage is developed with ground potential as a reference value. As the operational amplifier 38 receives as a reference signal $V_r$ the voltage which is developed across the resistor 42, the constant current circuit is not affected by the variation of the supply voltage $V_{cc}$. Accordingly, the drive current of the laser diode 35 is scarcely affected by the variation of the supply voltage.

As was described above, in the semiconductor laser drive circuit according to the invention, the high frequency voltage variation which occurs with the semiconductor laser as the laser beam is modulated is lessened by the buffer circuit and is not transmitted to the constant current circuit, so that the function of the constant current circuit is maintained unchanged. Accordingly, the laser beam power is never affected by the voltage variation described above.

As was also described above, for the semiconductor laser drive circuit of the invention, the constant current circuit outputs the constant current by receiving the predetermined voltage which is developed across the resistor with ground as a reference. Therefore, the drive current of the semiconductor device controlled by the constant current circuit is scarcely affected by the variation of the supply voltage.

Thus, the semiconductor laser drive circuit according to the invention can sufficiently deal with the variation of the supply voltage, and should be highly appreciated in practical use for a laser beam printer.

What is claimed is:

1. A semiconductor laser drive circuit, comprising:
   a semiconductor laser modulated in response to a modulated drive current;
   a first constant current circuit means for providing a constant drive current along a constant current path;
   means for modulating said constant drive current to obtain said modulated drive current; and
   buffer circuit means provided in said constant current path for isolating said current source from said voltage variations at said laser.

2. A laser drive circuit as recited in claim 1, wherein said buffer circuit comprises a transistor having a base held at a preset voltage and having a collector and an emitter through which said drive current passes.

3. A laser drive circuit as recited in claim 1, wherein said first constant current circuit means outputs a first constant current in response to a reference voltage developed by said first constant current across a grounded resistor.

4. A laser drive circuit as recited in claim 3, wherein said constant drive current is said first constant current.

5. A laser drive circuit as recited in claim 3, wherein said first constant current controls a second constant current circuit which is said source of said constant drive current.

6. A laser drive circuit as recited in claim 3, wherein said first constant current circuit comprises:
   an operational amplifier receiving on differential inputs a standard voltage and said reference voltage developed across said grounded resistor; and
   an amplifying transistor receiving on a control electrode an output of said operational amplifier and having a principal current electrode connected to said grounded resistor.

7. A semiconductor laser circuit as recited in claim 1, wherein said first constant current circuit means comprises:
   a first transistor providing said constant drive current on its principal current electrodes;
   a diode-connected second transistor, a base of which is connected to a base of said first transistor; and
   a negative feedback resistor connected to a principal current electrode of said second transistor for changing a base-emitter voltage of said first transistor in response to a change of a power supply of said second transistor;
   whereby said first transistor functions as a constant current source and receives biasing current from said second transistor.

8. A semiconductor laser drive circuit, comprising:
   a semiconductor laser modulated in response to a modulated drive current;

a resistor grounded on one side;

a constant current circuit for providing a constant drive current for said semiconductor laser in response to a reference voltage developed across said grounded resistor by a constant current of said constant current circuit; and means for modulating said constant drive current to obtain said modulated drive current.

9. A laser drive circuit as recited in claim 8, wherein said constant current circuit comprises:

an operational amplifier receiving as differential input voltages a standard voltage and said reference voltage; and an amplifying transistor having a control electrode connected to an output of said operational amplifier and having a principal current electrode connected to said grounded resistor.

* * * * *